(12) United States Patent
Macheiner et al.

(10) Patent No.: US 11,342,252 B2
(45) Date of Patent: May 24, 2022

(54) LEADFRAME LEADS HAVING FULLY PLATED END FACES

(71) Applicant: Infineon Technologies AG, Neubiberg (DE)

(72) Inventors: Stefan Macheiner, Kissing (DE); Markus Dinkel, Unterhaching (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 17/063,927

(22) Filed: Oct. 6, 2020

(65) Prior Publication Data

US 2021/0020553 A1 Jan. 21, 2021

Related U.S. Application Data

(63) Continuation of application No. 15/075,266, filed on Mar. 21, 2016, now Pat. No. 10,796,986.

(51) Int. Cl.
*H01L 21/48* (2006.01)
*H01L 23/495* (2006.01)
(Continued)

(52) U.S. Cl.
CPC ...... *H01L 23/49582* (2013.01); *H01L 21/288* (2013.01); *H01L 21/4825* (2013.01); *H01L 21/4828* (2013.01); *H01L 21/4842* (2013.01); *H01L 21/561* (2013.01); *H01L 22/12* (2013.01); *H01L 23/3107* (2013.01);
(Continued)

(58) Field of Classification Search
CPC . H01L 21/561; H01L 21/4842; H01L 21/288; H01L 21/4885–4889; H01L 21/4871–4875; H01L 21/4896; H01L 21/4821–4825; H01L 21/4828; H01L 23/49582; H01L 23/4951–49513; H01L 23/3107; H01L 23/49541; H01L 23/49548; H01L 23/49537; H01L 23/49861;
(Continued)

(56) References Cited

U.S. PATENT DOCUMENTS 5,521,432 A * 5/1996 Tsuji ................... H05K 3/3426
257/677
5,710,064 A 1/1998 Song et al.
(Continued)

OTHER PUBLICATIONS

Non-Final Office Acted dated Oct. 24, 2016 in U.S. Appl. No. 15/075,266.
(Continued)

*Primary Examiner* — Errol V Fernandes
*Assistant Examiner* — Jeremy J Joy
(74) *Attorney, Agent, or Firm* — Dicke, Billig & Czaja, PLLC

(57) ABSTRACT

A semiconductor device includes a leadframe, a semiconductor die attached to the leadframe, and an encapsulation material encapsulating the semiconductor die and a portion of the leadframe. The leadframe includes a first main face and a second main face opposite to the first main face. The leadframe includes leads wherein each lead includes a fully plated end face extending between an unplated first sidewall and an unplated second sidewall opposite to the first sidewall. The end face and the first and second sidewalls of each lead are perpendicular to the first and second main faces.

18 Claims, 5 Drawing Sheets

(51) Int. Cl.
*H01L 21/288* (2006.01)
*H01L 21/56* (2006.01)
*H01L 21/66* (2006.01)
*H01L 23/31* (2006.01)
*H01L 23/498* (2006.01)
*H01L 23/00* (2006.01)

(52) U.S. Cl.
CPC .... *H01L 23/4951* (2013.01); *H01L 23/49503* (2013.01); *H01L 23/49513* (2013.01); *H01L 23/49548* (2013.01); *H01L 23/49861* (2013.01); *H01L 24/32* (2013.01); *H01L 24/49* (2013.01); *H01L 24/73* (2013.01); *H01L 24/83* (2013.01); *H01L 24/97* (2013.01); *H01L 24/48* (2013.01); *H01L 2224/32245* (2013.01); *H01L 2224/48091* (2013.01); *H01L 2224/48106* (2013.01); *H01L 2224/48247* (2013.01); *H01L 2224/48465* (2013.01); *H01L 2224/73265* (2013.01); *H01L 2224/97* (2013.01); *H01L 2924/00014* (2013.01)

(58) Field of Classification Search
CPC ..... H01L 23/498–49805; H01L 23/495; H01L 24/73; H01L 24/97
See application file for complete search history.

(56) References Cited

U.S. PATENT DOCUMENTS

| | | | |
|---|---|---|---|
| 6,194,777 B1 * | 2/2001 | Abbott | H01L 23/49582 257/666 |
| 6,245,448 B1 | 6/2001 | Abbott | |
| 6,518,508 B2 | 2/2003 | Park et al. | |
| 6,583,500 B1 * | 6/2003 | Abbott | H01L 23/49582 257/666 |
| 6,608,366 B1 * | 8/2003 | Fogelson | H01L 23/3107 257/666 |
| 6,611,047 B2 | 8/2003 | Hu et al. | |
| 6,696,747 B1 | 2/2004 | Lee et al. | |
| 6,828,660 B2 * | 12/2004 | Abbott | H01L 23/49582 257/666 |
| 6,917,097 B2 | 7/2005 | Chow et al. | |
| 9,324,637 B1 * | 4/2016 | Bai | H01L 21/561 |
| 2001/0054750 A1 | 12/2001 | Abbott | |
| 2002/0053721 A1 * | 5/2002 | Kubara | H01L 23/49582 257/666 |
| 2003/0146497 A1 | 8/2003 | Abbott et al. | |
| 2005/0233500 A1 | 10/2005 | Kim | |
| 2006/0049493 A1 | 3/2006 | Lee et al. | |
| 2006/0138615 A1 * | 6/2006 | Sato | H01L 23/49582 257/666 |
| 2007/0102807 A1 * | 5/2007 | Pohl | H05K 1/141 257/700 |
| 2007/0126092 A1 | 6/2007 | San Antonio et al. | |
| 2008/0173991 A1 * | 7/2008 | Cruz | H01L 24/36 257/676 |
| 2009/0065915 A1 | 3/2009 | Lehmann | |
| 2010/0078803 A1 | 4/2010 | Andou et al. | |
| 2010/0109135 A1 | 5/2010 | Jereza | |
| 2010/0164078 A1 * | 7/2010 | Madrid | H01L 24/40 257/675 |
| 2010/0187663 A1 * | 7/2010 | Celaya | H01L 23/49582 257/666 |
| 2011/0108965 A1 * | 5/2011 | Hess | H01L 23/49548 257/676 |
| 2011/0164078 A1 | 7/2011 | Katoh et al. | |
| 2012/0108013 A1 * | 5/2012 | Fujisawa | H01L 21/52 438/123 |
| 2014/0001616 A1 * | 1/2014 | Daniels | H01L 23/49541 257/676 |
| 2015/0380384 A1 * | 12/2015 | Williams | H01L 23/49555 438/112 |
| 2016/0027721 A1 | 1/2016 | Lee et al. | |
| 2016/0254214 A1 | 9/2016 | Makino | |
| 2017/0271246 A1 | 9/2017 | Macheiner et al. | |

OTHER PUBLICATIONS

Non-Final Office Acted dated Mar. 24, 2017 in U.S. Appl. No. 15/075,266.
Non-Final Office Acted dated Oct. 6, 2017 in U.S. Appl. No. 15/075,266.
Non-Final Office Acted dated Mar. 10, 2020 in U.S. Appl. No. 15/075,266.
Final Office Acted dated Dec. 15, 2016 in U.S. Appl. No. 15/075,266.
Final Office Acted dated Jun. 15, 2017 in U.S. Appl. No. 15/075,266.
Final Office Acted dated Dec. 15, 2017 in U.S. Appl. No. 15/075,266.

* cited by examiner

LEADFRAME LEADS HAVING FULLY PLATED END FACES

CROSS REFERENCE TO RELATED APPLICATION

This Utility patent application is a continuation application of U.S. patent application Ser. No. 15/075,266 filed Mar. 21, 2016, which is incorporated herein by reference.

BACKGROUND

A semiconductor device may include a leadframe having leads for electrically coupling the semiconductor device to a circuit board. The leads of the semiconductor device may be soldered to the circuit board. Automated optical inspection (AOI) may be used to inspect solder wetting between the leads of the semiconductor device and the circuit board. Some semiconductor devices, however, which have a leadless package (e.g., quad-flat no-lead (QFN) or dual-flat no-lead (DFN)) or a short lead package, may be unsuitable for AOI.

For these and other reasons, there is a need for the present invention.

SUMMARY

One example of a semiconductor device includes a leadframe, a semiconductor die attached to the leadframe, and an encapsulation material encapsulating the semiconductor die and a portion of the leadframe. The leadframe includes a first main face and a second main face opposite to the first main face. The leadframe includes leads wherein each lead includes a fully plated end face extending between an unplated first sidewall and an unplated second sidewall opposite to the first sidewall. The end face and the first and second sidewalls of each lead are perpendicular to the first and second main faces.

DETAILED DESCRIPTION

In the following Detailed Description, reference is made to the accompanying drawings, which form a part hereof, and in which is shown by way of illustration specific examples in which the disclosure may be practiced. In this regard, directional terminology, such as "top," "bottom," "front," "back," "leading," "trailing," etc., is used with reference to the orientation of the Figure(s) being described. Because components of examples can be positioned in a number of different orientations, the directional terminology is used for purposes of illustration and is in no way limiting. It is to be understood that other examples may be utilized and structural or logical changes may be made without departing from the scope of the present disclosure. The following detailed description, therefore, is not to be taken in a limiting sense, and the scope of the present disclosure is defined by the appended claims.

It is to be understood that the features of the various examples described herein may be combined with each other, unless specifically noted otherwise.

As used herein, the term "electrically coupled" is not meant to mean that the elements must be directly coupled together and intervening elements may be provided between the "electrically coupled" elements.

For automated optical inspection (AOI) to determine whether solder wetting between a lead of a semiconductor device and a circuit board is acceptable, the solder should form a solder fillet extending up the end face of the lead. Semiconductor devices having a leadless package or a short lead package may not enable AOI since the end face of each lead of the package may not allow solder wetting. Accordingly, semiconductor devices as described herein include leads having a fully plated end face that enables solder wetting to provide a solder fillet. In this way, AOI may be used to inspect solder wetting between the semiconductor devices and a circuit board.

Figure 1A:
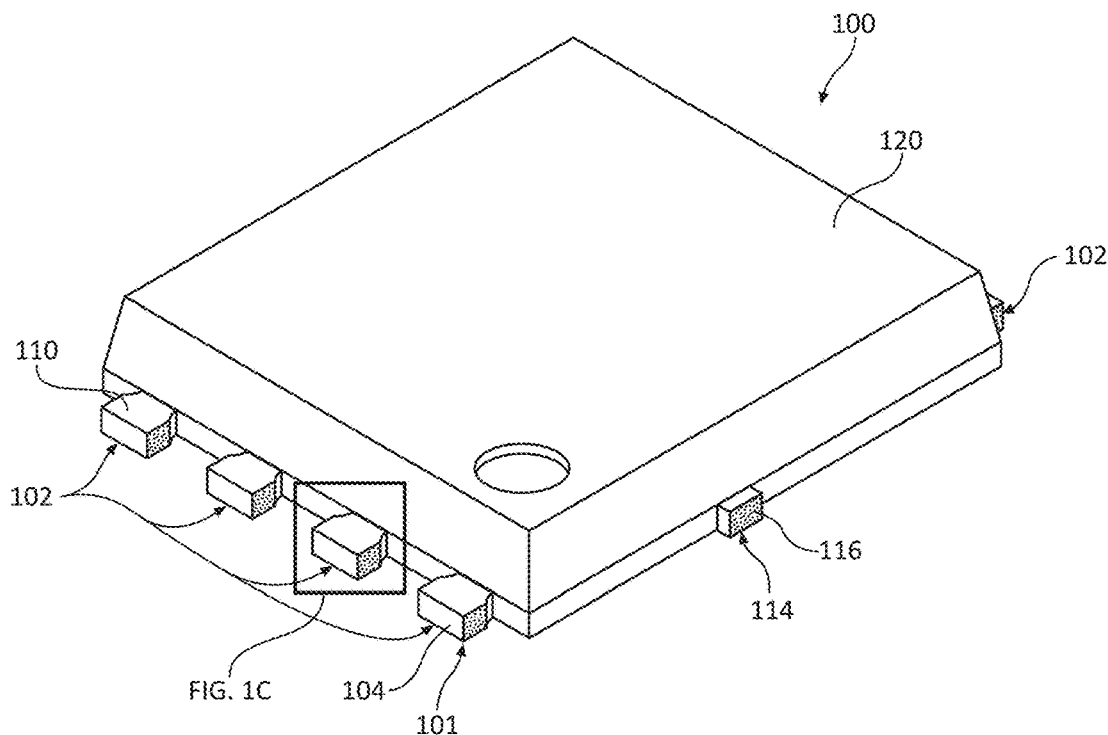
FIGS. 1A-1C illustrate various views of one example of a semiconductor device including leads having fully plated end faces.
Figure 1B:
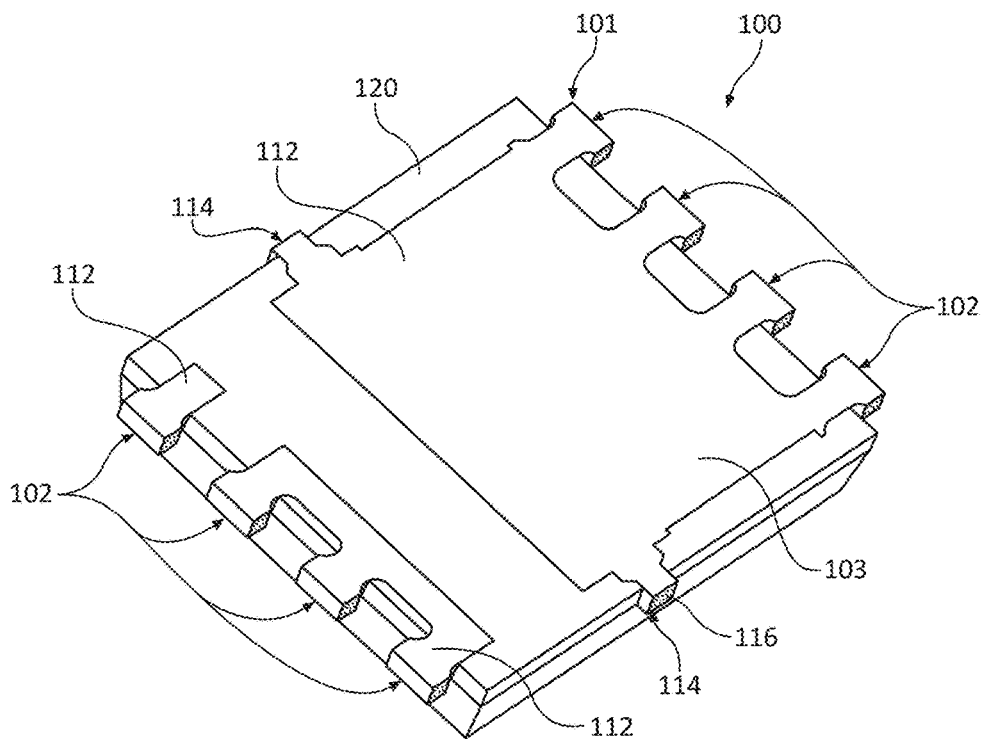
Figure 1C:
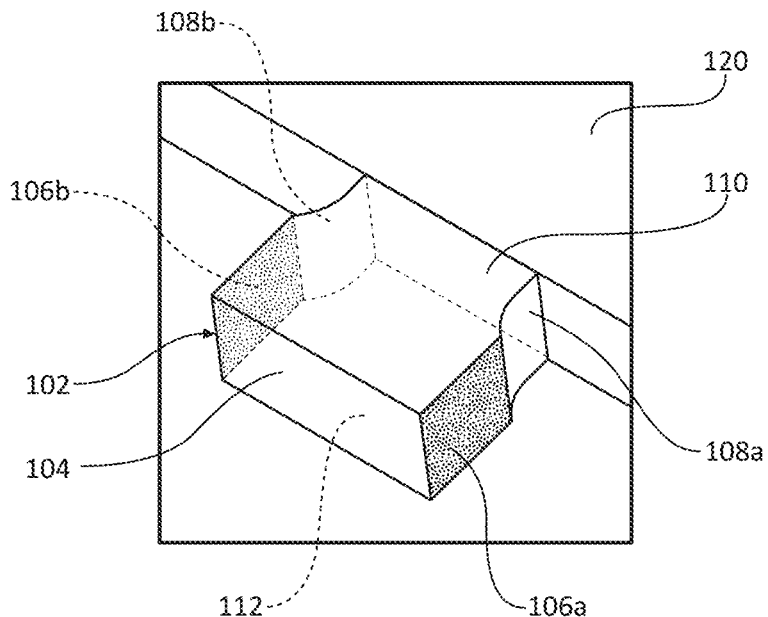

FIG. 1A illustrates a top perspective view and FIG. 1B illustrates a bottom perspective view of one example of a semiconductor device 100 including leads having fully plated end faces. FIG. 1C illustrates an enlarged view of one example of a lead of semiconductor device 100 including a fully plated end face. Semiconductor device 100 includes a semiconductor die (not visible) attached to a leadframe 101. The semiconductor die and portions of leadframe 101 are encapsulated by an encapsulation material 120 (e.g., mold material).

Leadframe 101 includes a first main face 110 (i.e., top surface) and a second main face 112 (i.e., bottom surface) opposite to the first main face 110. Leadframe 101 may include copper, a copper alloy, a nickel-iron alloy, or another suitable metal. Leadframe 101 is plated with a material layer (e.g., tin, solder, solder alloy) to improve the solderability of leadframe 101 to a circuit board. Leadframe 101 includes a die pad 103, a plurality of leads 102, and tiebars 114.

Each tiebar 114 connects die pad 103 of leadframe 101 to a frame of a leadframe strip prior to singulation to separate leadframe 101 from the leadframe strip. Each tiebar 114 includes an end face 116 extending between first main face 110 and second main face 112 of leadframe 101. Each end face 116 is unplated since each end face 116 is formed when leadframe 101 is singulated from a leadframe strip. Accordingly, each end face 116 exposes the metal of leadframe 101. The sidewalls of each tiebar 114 extending between end face 116 and encapsulation material 120 are plated since the sidewalls are not severed during singulation of leadframe 101 from a leadframe strip.

As illustrated in FIG. 1C, each lead 102 includes first main face 110 and second main face 112 of leadframe 101. In addition, each lead 102 includes a fully plated end face 104, first and second unplated sidewalls 106a and 106b, and first and second plated sidewalls 108a and 108b, respectively. First unplated sidewall 106a is opposite to second unplated sidewall 106b. Each unplated sidewall 106a and 106b extends between first main face 110 and second main face 112. In one example, first and second unplated sidewalls 106a and 106b are planar and perpendicular to end face 104. First and second sidewalls 106a and 106b are formed when leadframe 101 is singulated from a leadframe strip. Accordingly, first and second sidewalls 106a and 106b expose the metal of leadframe 101. In other examples, first and second unplated sidewalls 106a and 106b may have another suitable shape.

First plated sidewall 108a is opposite to second plated sidewall 108b. Each plated sidewall 108a and 108b extends between first main face 110 and second main face 112. In one example, first and second plated sidewalls 108a and 108b are concave and extend between first and second unplated sidewalls 106a and 106b and encapsulation material 120, respectively. First and second sidewalls 108a and 108b are plated since they are not severed during singulation of leadframe 101 from a leadframe strip. In other examples, first and second plated sidewalls 108a and 108b have another suitable shape.

Fully plated end face 104 extends between first main face 110 and second main face 112 and between first unplated sidewall 106a and second unplated sidewall 106b. End face 104 is plated since end face 104 is not severed during singulation of leadframe 101 from a leadframe strip. Fully plated end face 104 enables AOI of solder wetting between lead 102 and a circuit board since the plating enables solder wetting of end face 104. In this way, a solder fillet suitable for AOI is formed on end face 104 when lead 102 is soldered to a circuit board.

Figure 2:
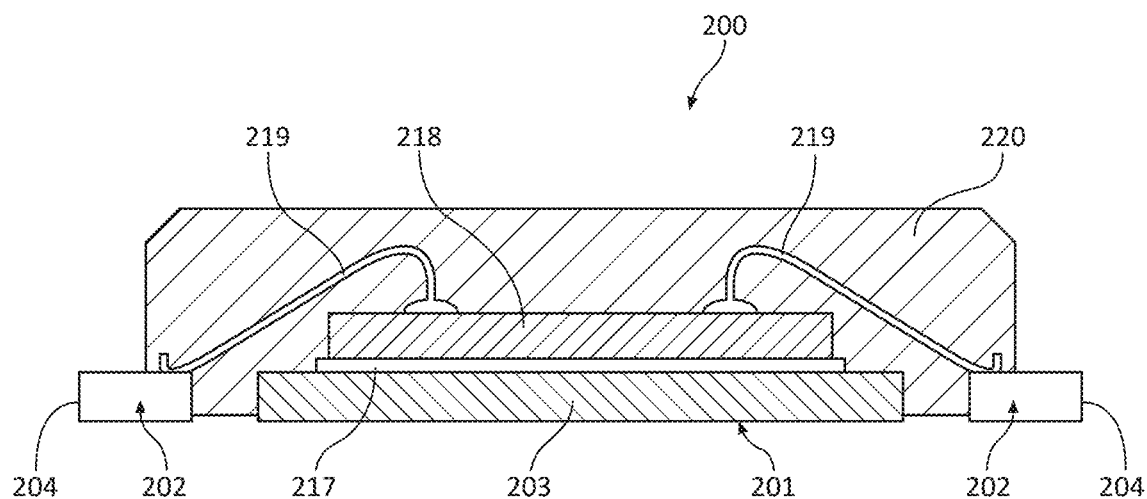
FIG. 2 illustrates a cross-sectional view of one example of a semiconductor device including leads having fully plated end faces.

FIG. 2 illustrates a cross-sectional view of one example of a semiconductor device 200 including leads having fully plated end faces. Semiconductor device 200 includes a leadframe 201, a semiconductor die 218, bond wires 219, and encapsulation material 220. Leadframe 201 includes a die pad 203 and leads 202. Semiconductor die 218 is coupled to die pad 203 of leadframe 201. In one example, semiconductor die 218 is electrically and/or thermally coupled to die pad 203 via an electrically conductive and/or thermally conductive material layer 217 (e.g., solder). In another example, semiconductor die 218 is electrically isolated from die pad 203 by a dielectric material layer 217 (e.g., a non-conductive adhesive). Contacts on the upper surface of semiconductor die 218 are electrically coupled to corresponding leads 202 via bond wires 219. In other examples, bond wires 219 may be replaced with other suitable interconnects, such as ribbons and/or clips. Bond wires 219, semiconductor die 218, material layer 217, and portions of leadframe 201 are encapsulated by encapsulation material 220.

Each lead 202 includes a fully plated end face 204. In one example, each lead 202 is similar to lead 102 previously described and illustrated with reference to FIG. 1C. Fully plated end face 204 of each lead 202 enables AOI of solder wetting between each lead 202 and a circuit board when semiconductor device 200 is soldered to a circuit board.

Figure 3:
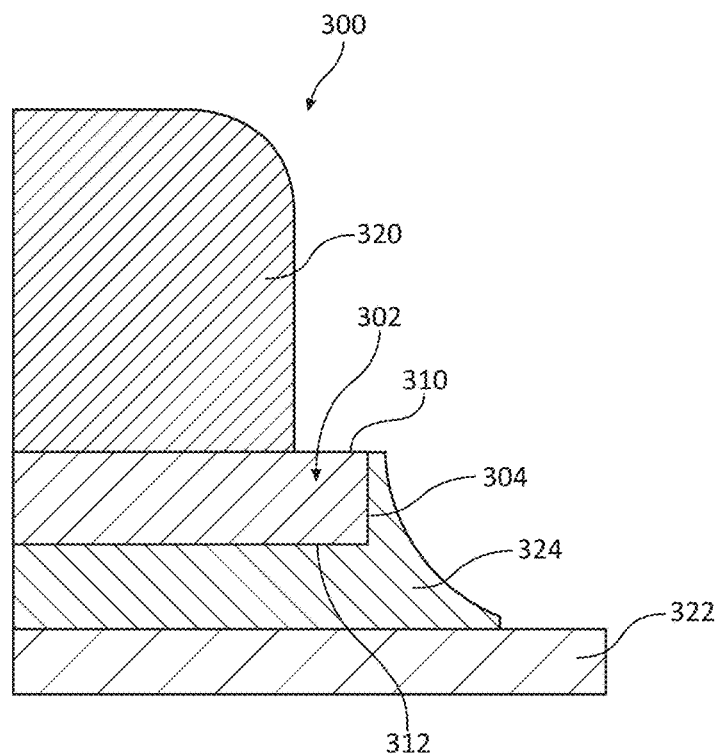
FIG. 3 illustrates a cross-sectional view of one example of a portion of a semiconductor device electrically coupled to a circuit board.

FIG. 3 illustrates a cross-sectional view of one example of a portion of a semiconductor device 300 electrically coupled to a circuit board 322. Semiconductor device 300 includes a lead 302 including a first main face 310, a second main face 312 opposite to first main face 310, and a fully plated end face 304 extending between first main face 310 and second main face 312. An encapsulation material 320 partially encapsulates lead 302. Lead 302 is electrically coupled to circuit board 322 via solder 324. Due to the fully plated end face 304 of lead 302, end face 304 is wettable by solder such that a fillet of solder is formed on end face 304 when lead 302 is soldered to circuit board 322. The fillet of solder formed on end face 304 enables AOI of solder wetting between lead 302 and circuit board 322.

Figure 4:
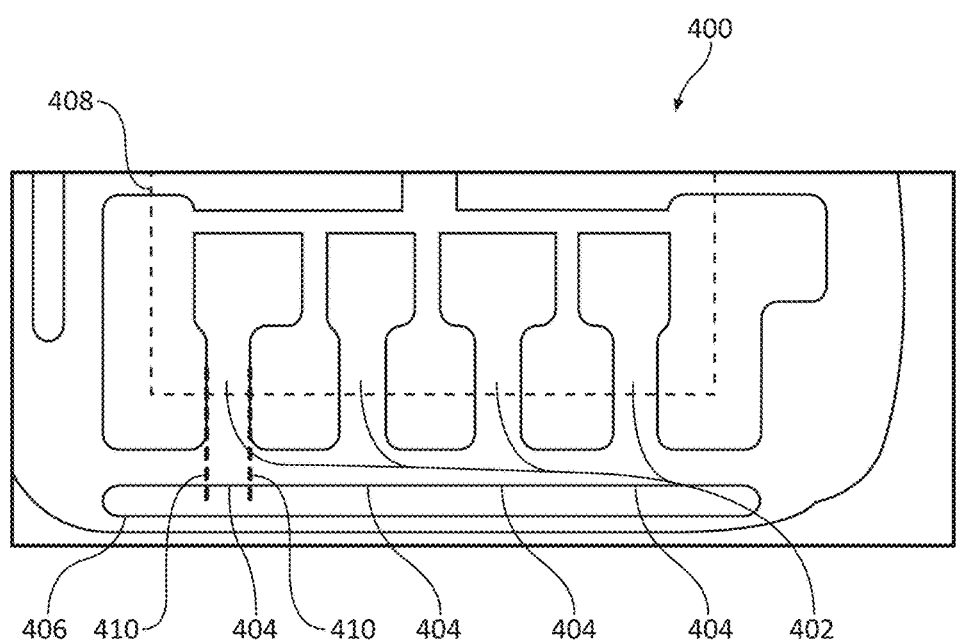
FIG. 4 illustrates a top view of one example of a portion of a leadframe prior to singulation including leads having fully plated end faces.

FIG. 4 illustrates a top view of one example of a portion of a leadframe 400 prior to singulation including leads having fully plated end faces. An outline of encapsulation material that may encapsulate a semiconductor die and a portion of leadframe 400 is indicated at 408 by dashed lines. The surfaces of leadframe 400 are plated such that leadframe 400 includes leads 402 having fully plated end faces 404. Fully plated end faces 404 are provided by opening 406 through leadframe 400. To singulate leadframe 400 from other leadframes of a leadframe strip, each lead 402 is severed as indicated by dashed lines 410 to provide unplated sidewalls of each lead 402. In this way, the end faces 404 of each lead 402 are not severed and therefore remain fully plated after singulation of leadframe 400 from a leadframe strip.

Figure 5:
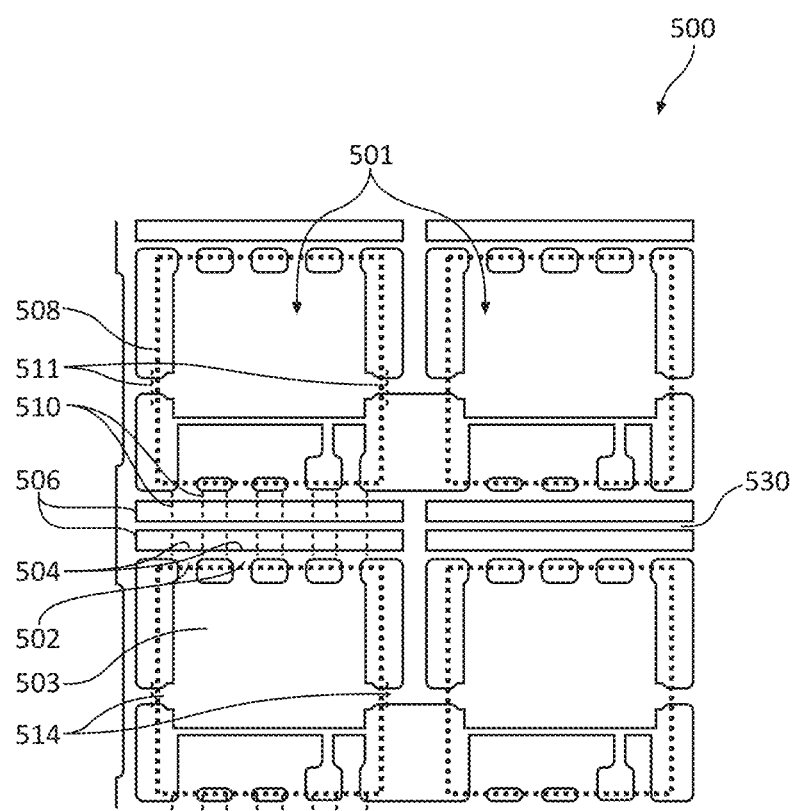
FIG. 5 illustrates a top view of one example of a leadframe strip including a plurality of leadframes.

FIG. 5 illustrates a top view of one example of a leadframe strip 500 including a plurality of leadframes 501 connected to each other via a frame 530. An outline of encapsulation material that may encapsulate a semiconductor die and a portion of each leadframe 501 is indicated at 508 by dashed lines. Leadframe strip 500 may include any suitable number of leadframes 501 arranged in rows and columns. Each leadframe 501 includes a die pad 503, leads 502, and tiebars 514. Die pads 503, leads 502, and tiebars 514 are connected to each other via frame 530. Each lead 502 has a fully plated end face 504. Fully plated end faces 504 are provided by openings 506 through leadframe strip 500. Leadframe strip 500 may be formed by cutting, stamping, punching, or etching sheet material to provide openings, including openings 506, defining frame 530 and each leadframe 501.

Once frame 530 and each leadframe 501 is formed, leadframe strip 500 is plated with a material (e.g., tin, solder, solder alloy) to improve the solderability of each leadframe 501 to a circuit board. In one example, leadframe strip 500 is plated (e.g., via an electroplating process) prior to attaching the semiconductor dies to each leadframe 501 and encapsulating each semiconductor die. In another example, leadframe strip 500 is plated (e.g., via an electroless plating process) after attaching the semiconductor dies to each leadframe 501 and encapsulating each semiconductor die.

To singulate each leadframe 501 from leadframe strip 500, each lead 502 is severed as indicated by dashed lines 510 to provide unplated sidewalls of each lead 502. In this way, the end faces 504 of each lead are not severed and therefore remain fully plated after singulation of each leadframe 501 from leadframe strip 500. In addition, to singulate each leadframe 501 from leadframe strip 500, each tiebar 514 is severed as indicated by dashed lines 511 to provide unplated end faces of each tiebar 514. Each leadframe 501 may be singulated from leadframe strip 500 by cutting, stamping, punching, etching, or other suitable process. In one example, leadframe strip 500 is singulated to provide a plurality of leadframes, such as leadframe 600 illustrated in the following FIG. 6.

Figure 6:
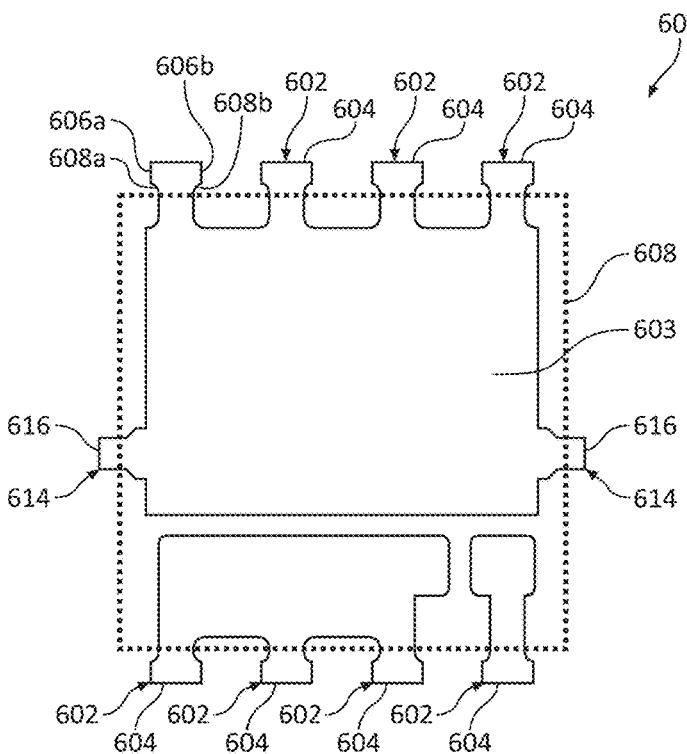
FIG. 6 illustrates a top view of one example of a leadframe after singulation of the leadframe from the leadframe strip illustrated in FIG. 5.

FIG. 6 illustrates a top view of one example of a leadframe 600 after singulation from a leadframe strip, such as leadframe strip 500 previously described and illustrated with reference to FIG. 5. An outline of encapsulation material that may encapsulate a semiconductor die and a portion of leadframe 600 is indicated at 608 by dashed lines. Leadframe 600 includes leads 602, a die pad 603, and tiebars 614.

Each lead 602 has a fully plated end face 604, first and second unplated sidewalls 606a and 606b, and first and second plated sidewalls 608a and 608b.

Each tiebar 614 includes an unplated end face 616. Each end face 616 is unplated since each end face 616 is formed when leadframe 600 is singulated from a leadframe strip. Accordingly, each end face 616 exposes the metal of leadframe 600. The sidewalls of each tiebar 614 extending between end face 616 and encapsulation material 608 are plated since the sidewalls are not severed during singulation of leadframe 600 from a leadframe strip.

First unplated sidewall 606a of each lead 602 is opposite to second unplated sidewall 606b of each lead 602. In one example, first and second unplated sidewalls 606a and 606b are planar and perpendicular to end face 604. First and second sidewalls 606a and 606b are formed when leadframe 600 is singulated from a leadframe strip. Accordingly, first and second sidewalls 606a and 606b expose the metal of leadframe 600. In other examples, first and second unplated sidewalls 606a and 606b may have another suitable shape.

First plated sidewall 608a of each lead 602 is opposite to second plated sidewall 608b of each lead 602. In one example, first and second plated sidewalls 608a and 608b are concave and extend between first and second unplated sidewalls 606a and 606b and encapsulation material 608, respectively. First and second sidewalls 608a and 608b are plated since they are not severed during singulation of leadframe 600 from a leadframe strip.

Fully plated end face 604 of each lead 602 extends between first unplated sidewall 606a and second unplated sidewall 606b. End face 604 is plated since end face 604 is not severed during singulation of leadframe 600 from a leadframe strip. Fully plated end face 604 enables AOI of solder wetting between each lead 602 and a circuit board since the plating enables solder wetting of end face 604. In this way, a solder fillet suitable for AOI is formed on end face 604 when each lead 602 is soldered to a circuit board.

Figure 7:
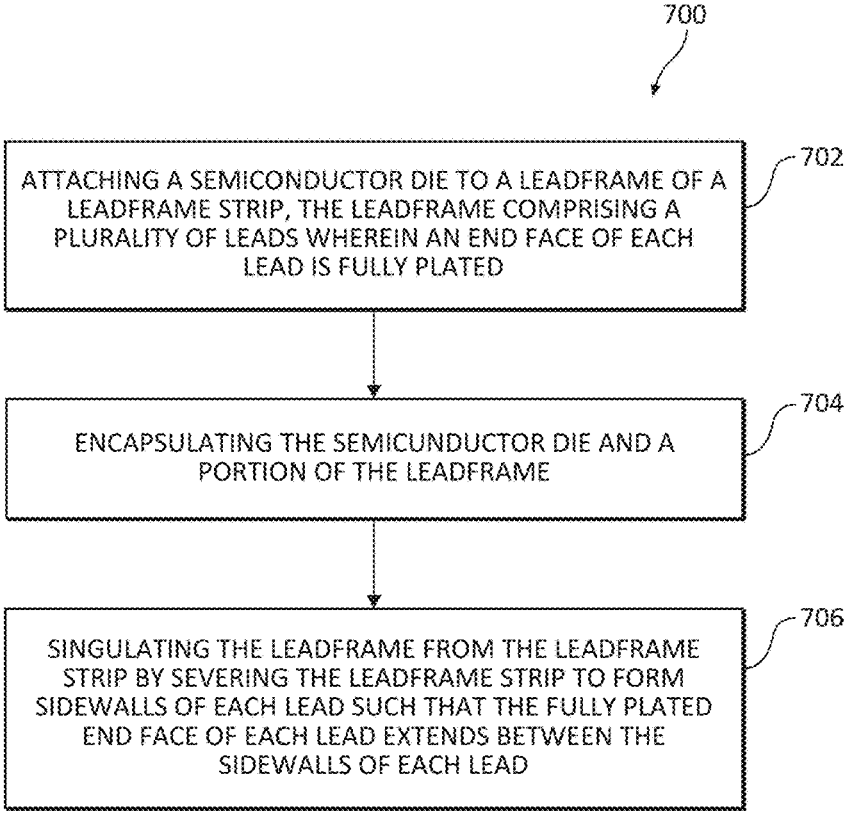
FIG. 7 is a flow diagram illustrating one example of a method for fabricating a semiconductor device including leads having fully plated end faces.

FIG. 7 is a flow diagram illustrating one example of a method 700 for fabricating a semiconductor device including leads having fully plated end faces. At 702, method 700 includes attaching a semiconductor die to a leadframe of a leadframe strip, the leadframe comprising a plurality of leads wherein an end face of each lead is fully plated. At 704, method 700 includes encapsulating the semiconductor die and a portion of the leadframe. At 706, method 700 includes singulating the leadframe from the leadframe strip by severing the leadframe strip to form sidewalls of each lead such that the fully plated end face of each lead extends between the sidewalls of each lead. The leadframe may be singulated from the leadframe strip by cutting, stamping, punching, etching, or other suitable process.

In one example, method 700 further includes forming the leadframe strip via stamping or etching. Method 700 may also include plating (e.g., via an electroplating process) the leadframe strip prior to attaching the semiconductor die. In another example, the leadframe strip may be plated (e.g., via an electroless plating process) after attaching the semiconductor die. Attaching the semiconductor die to the leadframe may include electrically coupling the semiconductor die to a die pad of the leadframe. Method 700 may also include soldering each lead of the leadframe to a circuit board and inspecting solder wetting between each lead of the leadframe and the circuit board via an automated optical inspection process.

Although specific examples have been illustrated and described herein, a variety of alternate and/or equivalent implementations may be substituted for the specific examples shown and described without departing from the scope of the present disclosure. This application is intended to cover any adaptations or variations of the specific examples discussed herein. Therefore, it is intended that this disclosure be limited only by the claims and the equivalents thereof.

The invention claimed is:

1. A method for fabricating a semiconductor device, the method comprising:
attaching a semiconductor die to a leadframe of a leadframe strip, the leadframe comprising a plurality of leads wherein an end face of each lead is fully plated;
encapsulating the semiconductor die and a portion of the leadframe with an encapsulation material; and
singulating the leadframe from the leadframe strip by severing the leadframe strip to form a first unplated sidewall and a second unplated sidewall of each lead such that the fully plated end face of each lead extends between the first and second unplated sidewalls of each lead and such that a first plated sidewall of each lead extends from the first unplated sidewall of each lead to the encapsulation material and a second plated sidewall of each lead extends from the second unplated sidewall of each lead to the encapsulation material,
wherein the first plated sidewall of each lead is nonplanar and the second plated sidewall of each lead is nonplanar,
wherein each lead, on a first side of the lead, includes only the first unplated sidewall and the first plated sidewall, and
wherein each lead, on a second side of the lead opposite to the first side of the lead, includes only the second unplated sidewall and the second plated sidewall.

2. The method of claim 1, wherein the first and second plated sidewalls of each lead are curved.

3. The method of claim 1, further comprising:
forming the leadframe strip via stamping.

4. The method of claim 1, further comprising:
forming the leadframe strip via etching.

5. The method of claim 1, further comprising:
plating the leadframe strip prior to attaching the semiconductor die.

6. The method of claim 1, further comprising:
plating the leadframe strip after attaching the semiconductor die.

7. The method of claim 1, wherein attaching the semiconductor die to the leadframe comprises electrically coupling the semiconductor die to a die pad of the leadframe.

8. The method of claim 1, further comprising:
soldering each lead of the leadframe to a circuit board; and
inspecting solder wetting between each lead of the leadframe and the circuit board via an automated optical inspection process.

9. A method for fabricating a semiconductor device, the method comprising:
attaching a semiconductor die to a leadframe of a leadframe strip, the leadframe comprising a plurality of leads;
encapsulating the semiconductor die and a portion of the leadframe with an encapsulation material;
plating the leadframe strip; and
singulating the leadframe from the leadframe strip by severing the leadframe strip to form an end face of each lead that is fully plated, a first unplated sidewall and a second unplated sidewall of each lead such that the fully plated end face of each lead extends between the first and second unplated sidewalls of each lead, a first plated sidewall of each lead extending between the first unplated sidewall of each lead and the encapsulation material, and a second plated sidewall of each lead extending between the second unplated sidewall of each lead and the encapsulation material, wherein the first plated sidewall of each lead is nonplanar and the second plated sidewall of each lead is nonplanar, wherein each lead, on a first side of the lead, includes only the first unplated sidewall and the first plated sidewall, and wherein each lead, on a second side of the lead opposite to the first side of the lead, includes only the second unplated sidewall and the second plated sidewall.

10. The method of claim 9, wherein the first and second plated sidewalls of each lead are concave.

11. The method of claim 9, further comprising:
forming the leadframe strip via stamping.

12. The method of claim 9, further comprising:
forming the leadframe strip via etching.

13. The method of claim 9, wherein attaching the semiconductor die to the leadframe comprises electrically coupling the semiconductor die to a die pad of the leadframe.

14. The method of claim 9, further comprising:
soldering each lead of the leadframe to a circuit board; and
inspecting solder wetting between each lead of the leadframe and the circuit board via an automated optical inspection process.

15. A method for fabricating a semiconductor device, the method comprising:
attaching a semiconductor die to a leadframe of a leadframe strip, the leadframe comprising a first main face disposed entirely in a first plane and a second main face opposite to the first main face disposed entirely in a second plane, the leadframe comprising leads wherein each lead comprises a fully plated planar end face;
encapsulating the semiconductor die and a portion of the leadframe with an encapsulation material; and
singulating the leadframe from the leadframe strip by severing the leadframe strip to form, for each lead, an unplated first sidewall on a first side of the lead, an unplated second sidewall on a second side of the lead that is opposite to the unplated first sidewall of the lead, a plated first sidewall on the first side of the lead that is between the unplated first sidewall and the encapsulation material, and a plated second sidewall on the second side of the lead that is between the unplated second sidewall and the encapsulation material, wherein for each lead, the fully plated planar end face extends between the unplated first sidewall and the unplated second sidewall and the unplated first sidewall and the unplated second sidewall are perpendicular to the first and second main faces, wherein each lead, on the first side of the lead, includes only the unplated first sidewall and the plated first sidewall, wherein each lead, on the second side of the lead, includes only the unplated second sidewall and the plated second sidewall, wherein for each lead, the plated first sidewall is nonplanar with the unplated first sidewall, and wherein for each lead, the plated second sidewall is nonplanar with the unplated second sidewall.

16. The method of claim 15, wherein for each lead, the unplated first sidewall is planar and wherein the unplated second sidewall is planar and parallel to the unplated first sidewall.

17. The method of claim 15, wherein for each lead, the first and second plated sidewalls are curved and concave.

18. The method of claim 15, further comprising:
soldering each lead of the leadframe to a circuit board; and
inspecting solder wetting between each lead of the leadframe and the circuit board via an automated optical inspection process.

* * * * *